United States Patent
Park et al.

(10) Patent No.: US 9,229,079 B2
(45) Date of Patent: Jan. 5, 2016

(54) PARALLEL MAGNETIC RESONANCE IMAGING METHOD FOR RADIAL TRAJECTORY

(71) Applicant: KAIST (Korea Advanced Institute of Science and Technology), Daejeon (KR)

(72) Inventors: HyunWook Park, Daejeon (KR); Joonsung Choi, Daejeon (KR)

(73) Assignee: KAIST (Korea Advanced Institute of Science and Technology), Daejeon (KR)

(*) Notice: Subject to any disclaimer, the term of this patent is extended or adjusted under 35 U.S.C. 154(b) by 470 days.

(21) Appl. No.: 13/714,123

(22) Filed: Dec. 13, 2012

(65) Prior Publication Data

US 2013/0162251 A1 Jun. 27, 2013

(30) Foreign Application Priority Data

Dec. 21, 2011 (KR) ........................ 10-2011-0138847

(51) Int. Cl.
*G01V 3/00* (2006.01)
*G01R 33/48* (2006.01)
*G01R 33/561* (2006.01)

(52) U.S. Cl.
CPC ............ *G01R 33/48* (2013.01); *G01R 33/5611* (2013.01); *G01R 33/4824* (2013.01)

(58) Field of Classification Search
CPC .................................................. G01R 33/5611
USPC .......................................... 324/309, 307, 314
See application file for complete search history.

(56) References Cited

U.S. PATENT DOCUMENTS

| 7,558,414 | B2 * | 7/2009 | Griswold | ...................... 382/128 |
| 7,583,082 | B1 * | 9/2009 | Hu et al. | ...................... 324/309 |
| 8,879,811 | B2 * | 11/2014 | Liu et al. | ...................... 382/128 |
| 8,901,927 | B2 * | 12/2014 | Gross | ............................ 324/309 |
| 8,948,480 | B2 * | 2/2015 | Liu et al. | ...................... 382/128 |

FOREIGN PATENT DOCUMENTS

| JP | 2008-173246 | 7/2008 |
| JP | 2009-153971 | 7/2009 |

* cited by examiner

*Primary Examiner* — Louis Arana
(74) *Attorney, Agent, or Firm* — IP & T Group LLP

(57) ABSTRACT

A parallel imaging (PI) method has been frequently used as a method for shortening an image acquisition time in the MRI field. The PI technique is a method for acquiring data using multi-channel coils, that is, several coils, when acquiring the data in MRI. According to this technique, data, the amount of which is smaller than that when the data is obtained using only one coil, is acquired, and then an image is obtained using coil information. According to an embodiment, a new image reconstruction method is proposed which adopts an expectation maximization (EM) technique that is different from the existing GRAPPA or SENSE technique when an image is obtained using PI data acquired through the radial trajectory.

6 Claims, 2 Drawing Sheets

PARALLEL MAGNETIC RESONANCE IMAGING METHOD FOR RADIAL TRAJECTORY

CROSS-REFERENCES TO RELATED APPLICATION

The present application claims priority under 35 U.S.C. 119(a) to Korean application number 2011-0138847, filed on Dec. 21, 2011, in the Korean Intellectual Property Office, which is incorporated by reference in its entirety as if set forth in full.

BACKGROUND OF THE INVENTION

1. Technical Field

The present invention relates to a parallel MR imaging method for radial trajectory, and more particularly to a parallel MR imaging method for radial trajectory, which can reconstruct a high-resolution image using a new parallel imaging method that can be used when radially sampling data to acquire an MR image.

2. Related Art

A parallel imaging (PI) method has been frequently used as a method for shortening an image acquisition time in the magnetic resonance imaging (MRI) field. The PI technique is a method for acquiring data using multi-channel coils, that is, several coils, when acquiring the data in MRI. According to this technique, data, the amount of which is smaller than that when the data is obtained using only one coil, is acquired, and then an image is obtained using coil information.

As PI methods in the related art, a radial generalized autocalibrating partially parallel acquisition (GRAPPA) method and an iterative sensitivity encoding (SENSE) method are known.

First, the radial GRAPPA method includes the following processing steps: (a) acquiring, from an MR imaging device, data g to be used for reconstruction and data ACS line to be used to obtain reconstruction coefficients, (b) obtaining the reconstruction coefficients c from a part of g and ACS line obtained in the step (a), (c) predicting unknown data g' for each coil using g and c obtained in (a, b), and (d) reconstructing g' obtained in (c) as a final image.

The radial GRAPPA method has the advantages that image reconstruction becomes possible even without acquiring sensitivity information of the coils in advance. Further, the radial GRAPPA method has the advantages that it requires a small amount of computation and an iterative reconstruction method is not required to be used. However, this method has a problem that the quality of an image is degraded due to errors of assumption that is used in a process of extending and applying the GRAPPA technique that is the basis of the present method to radial coordinate system sampling. That is, due to inaccuracy of the reconstruction coefficients obtained in (b), errors occur in a resultant image that is finally reconstructed. Since a detailed algorithm for this is described in "M. A. Griswold at al., Direct Parallel Imaging Reconstruction of Radially Sampled Data Using GRAPPA with Relative Shifts *ISMRM* 2003", the detailed explanation thereof will be omitted.

Next, the iterative SENSE method includes the following processing the steps: (1) calculating sensitivity information S from data pre-acquired through an MR imaging device, (2) obtaining an initial image f using data g acquired through the MR imaging device and S calculated in the step (1), (3) correcting an image through a conjugate gradient technique using f obtained in the step (2), and (4) replacing an image f' corrected through the step (3) by the initial image f in the step (2) and repeatedly performing the steps (2) and (3).

The above-described iterative SENSE method is a technique to repeatedly reconstruct an image, and reconstructs the image using the sensitivity information. The sensitivity information is information having brightness information of several coils that are used in MRI, and can be obtained with reference to the contents described in "Pruessmann K P, Weiger M, Scheidegger M B, Boesiger P. Coil sensitivity encoding for fast MRI. In: Proceedings of the ISMRM 6$^{th}$ Annual Meeting, Sydney, 1998. p 579."

Further, a detailed algorithm of the iterative SENSE is described in a paper "Klaas P. Pruessmann et al., Advances in Sensitivity Encoding With Arbitrary k-Space Trajectories *Magn Reson Med* 46:638-651 (2001)."

The iterative SENSE method has the advantage that it can reconstruct a relatively high-resolution image, but has the disadvantage that the error of the image diverges as the number of repetitions for reconstruction is increased in the case where noise occurs in the acquired data due to the characteristics of the conjugate gradient technique used in the above-mentioned step (3).

That is, the conjugate gradient technique used in the step (3) is a method that is frequently used when obtaining a desired solution using an inverse transform. According to this method, a direction in which it is repeatedly traced to reach an optimal solution, starting from a certain value. In this case, the conjugate is used to obtain the direction, and since the direction is unable to be appropriately obtained even if only a small amount of noise exists when the algorithm is actually applied, the resultant value gets far from the optimal solution as the number of repetitions is increased. Because of this, the iterative SENSE method that obtains the solution using the conjugate technique is also sensitive to the noise.

SUMMARY

The present invention has been made to solve the above-mentioned, problems occurring in the related art, and an object of the present invention is to provide a radial parallel MR imaging method, which can solve the problem that an image error, which occurs when the image reconstruction is repeated, diverges, while reconstructing a high-resolution image.

In order to achieve the above object, the present invention does not use the algorithm which has the problem that the resultant value gets far from the optimal solution as the number of repetitions is increased when reconstructing the image through repetition processing, and thus can perform high-quality image reconstruction.

Accordingly, the present invention can reconstruct a high-resolution image in comparison to the radial GRAPPA method and the iterative SENSE method in the related art, and can solve the problem that the image error diverges when the noise occurs as in the iterative SENSE method.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

BEST MODE FOR CARRYING OUT THE INVENTION

Hereinafter, an exemplary embodiment of the present invention is described in detail with reference to the accompanying drawings.

Figure 1:
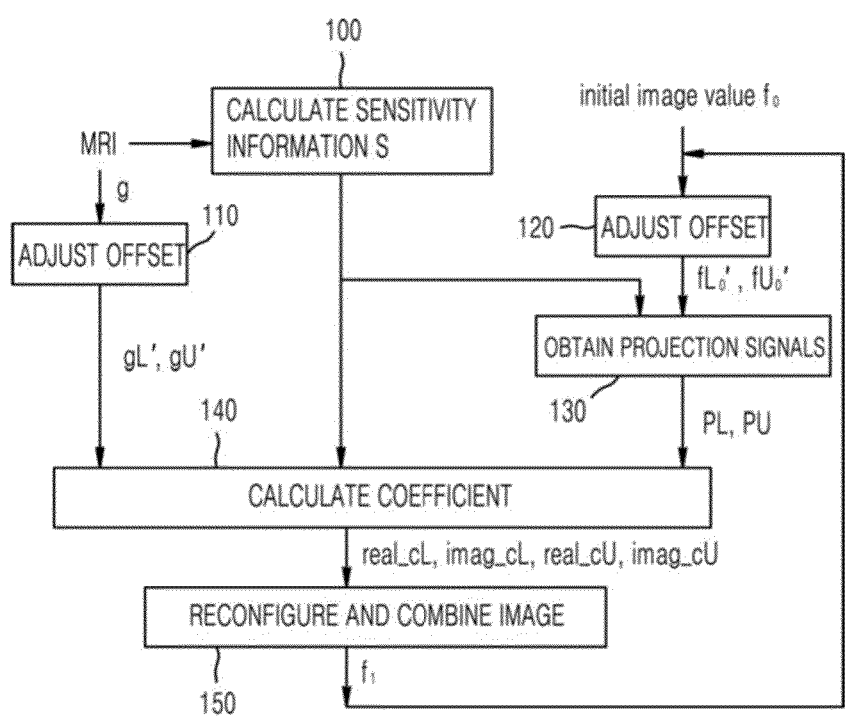
FIG. 1 is a processing flowchart of a parallel MR imaging method for radial trajectory according to an embodiment of the present invention.

FIG. 1 is a processing flowchart of a parallel MR imaging method for radial trajectory according to an embodiment of the present invention.

First, sensitivity information S is calculated from pre-acquired data through an MRI device (100). Then, a signal g that is radially sampled is received through parallel coils in the MRI device and two offset-adjusted signals gL' and gU' are obtained through increasing/decreasing a boundary value (110). An initial image value $f_0$ is received from en outside end two offset-adjusted signals $fL_0$' and $fU_0$' are obtained (120). Projection signals PL and PU are obtained using the sensitivity information S obtained in the step 100 and the two offset-adjusted signals $fL_0$' and $fU_0$' obtained in the step 120 (130). Coefficients real_cL, imag_cL, real_cU, and imag_cU are obtained using the sensitivity information S obtained in the step 100, the offset-adjusted signals gL' and gU' obtained in the step 110, and the projection signals PL and PU obtained in the step 130 (140). Then, an image is reconfigured by multiplying the coefficients real_cL, imag_cL, real_cU, and imag_cU obtained in the step 140 by the offset-adjusted signals $fL_0$' and $fU_0$' obtained in the step 120, and a first target image $f_1$ is acquired through combination of the images (150). Lastly, the initial input image value $f_0$ from the outside, which is the input value in the step 120, is replaced by the first target image $f_1$, and the step 120 to the step 150 are repeatedly performed until a final target image is obtained.

The sensitivity information S obtained in the step 100 is acquired through techniques proposed in "Pruessmann K P, Weiger M, Scheidegger M B, Boesiger P. Coil sensitivity encoding for fast MRI. In: Proceedings of the ISMRM 6th Annual Meeting, Sydney, 1998. p 579."

To obtain the offset-adjusted signals gL' and gU' in the step 110, the following detailed processing is performed. That is, two arbitrary complex constants L and U are defined (which may be defined by a user, or may be automatically defined). At this time, the two complex constants are defined as values that satisfy an image f to be reconstructed and the following inequalities:

$$real(L) < real(f) < real(U), imag(L) < imag(f) < imag(U)$$

In the above equation, real(x) and imag(x) are operators extracting a real part and an imaginary part of x.

An offset-adjusted signal g' is obtained from the constants that satisfy the above inequalities through an operation of:

$$gL' = g - \text{Radon}(L),$$

$$gU' = \text{Radon}(U) - g.$$

In the above equation, Radon(x) is Radon transform of x.

The offset-adjusted signals $fL_0$' and $fU_0$' in the step 120 are acquired as follows:

$$fL_0' = f_0 - L,$$

$$fU_0' = U - f_0.$$

Then, in the step 130, the projection signals PL and PU are obtained by multiplying the two offset-adjusted signals $fL_0$' and $fU_0$' generated in the step 120 by the sensitivity information S and performing Radon transform on the result of multiplication.

The coefficients real_cL, imag_cL, real_cU, and imag_cU in the step 140 are calculated as follows.

$$real\_cL = (real(gL')/real(fL_0'))*S,$$

$$imag\_cL = (imag(gL')/imag(fL_0'))*S,$$

$$real\_cU = (real(gU')/real(fU_0'))*S,$$

$$imag\_cU = (imag(gU')/imag(fU_0'))*S.$$

Then, the first target image $f_1$ generated in the step 150 is calculated and obtained as follows.

$$A = real(fL_0')*real\_cL + i*imag(fL_0')*imag\_cL,$$

$$B = real(fU_0')*real\_cU + i*imag(fU_0')*imag\_cU,$$

$$f_1 = (A*U + B*L)/(A+B).$$

described above, according to the present invention, since the solution is obtained in the steps 130 to 150 based on an expectation maximization technique rather than the conjugate gradient method, such as the iterative SENSE method in the related art, a high-quality image that is strong against noise can be reconstructed. Since the expectation maximization method has the characteristics that noise can be minimized through modeling of probability of signals even if the noise is generated, the method according to the present invention is also strong against the noise.

Figure 2:
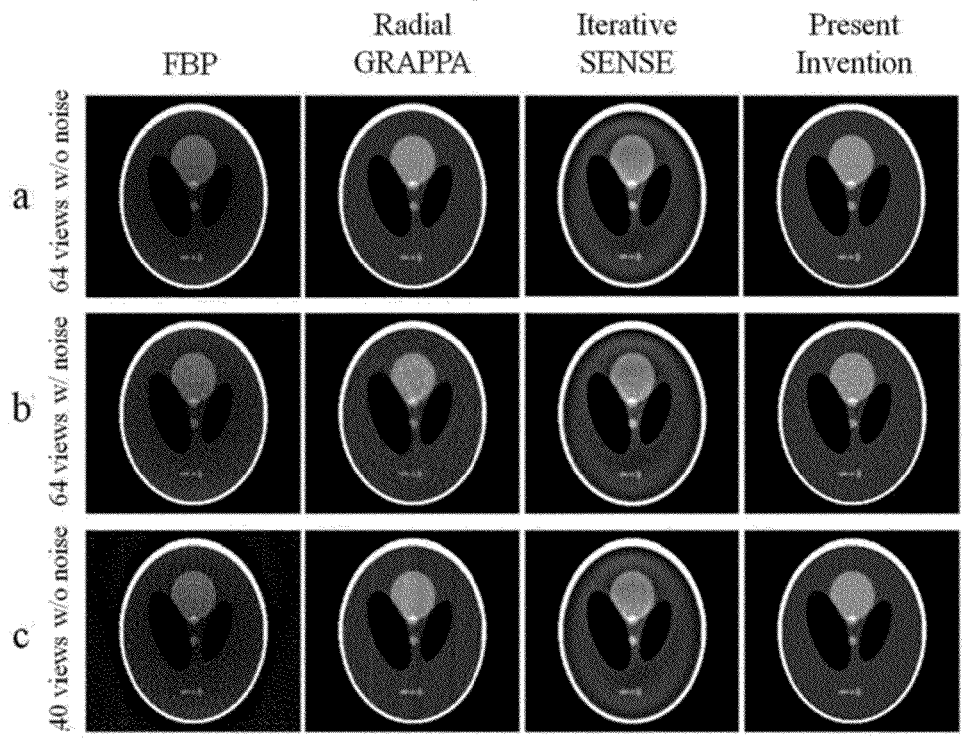
FIG. 2 is an exemplary diagram showing experimental results for comparing image reconstruction results in the related art and according to the present invention.

FIG. 2 is an exemplary diagram showing experimental results for comparing the image reconstruction results in the related art and according to the present invention. FIG. 2 shows the results of experiments in which noise is added while the amount of information that is used for the image reconstruction is changed.

In the drawing, 'FBP (Filtered Back Projection)' represents a normal image reconstruction method in which a parallel imaging method is not used, 'Radial GRAPPA' and 'Iterative SENSE' represent the above-described parallel imaging methods in the related art, and 'Present Invention'' represents a parallel imaging method according to the present invention.

The 'a' line shows the results of reconstruction in the respective methods in the environment where 64-line data is used and noise is not present, and the 'b' line shows the resultant images in the environment where 64-line data is used and noise is added. Lastly, the 'c' line shows the resultant images reconstructed in the environment where 40-line data is used and noise is not present.

As shown in the drawing, it can be confirmed that the parallel imaging method according to the present invention provides better image quality in comparison to other methods in the related art.

Figure 3:
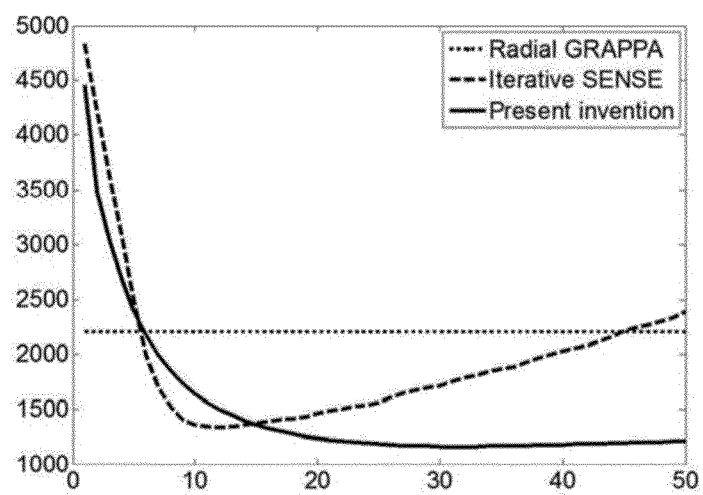
FIG. 3 is a graph for comparing performances in the related art and according to the present invention.

FIG. 3 is a graph for comparing performances in the related art and according to the present invention.

FIG. 3 is a graph showing the degree of difference between a true image and the reconstructed image, and respective curves indicate the change of the sum of absolute difference (SAD) values according to the number of repetitions of imaging. The x-axis represents the number of repetitions of imaging, and the y-axis represents the SAD value.

As the SAD value becomes small, the image reconstruction is performed well, while as the number of repetitions is increased, the SAD value according to the present invention becomes smallest. The above-described graph is a graph showing the resultant images reconstructed using the 64-line data in the case where noise is present. As can be confirmed from the drawing, according to the iterative SENSE technique in the related art, the image error abruptly diverges as the number of repetitions is increased, whereas according to the present invention, the image can be reconstructed more stably.

Although preferred embodiments of the present invention have been described for illustrative purposes, the scope of the present invention is not limited to the described embodiments, and those skilled in the art will appreciate that various modifications, additions and substitutions are possible, without departing from the scope and spirit of the invention as disclosed in the accompanying claims.

What is claimed is:

1. An MR imaging method for radial trajectory, comprising:
    a first step of calculating sensitivity information S from pre-acquired data through an MRI device;
    a second step of receiving an input of a signal g that is radially sampled through parallel coils in the MRI device and obtaining two offset-adjusted signals gL' and gU' through increasing/decreasing a boundary value;
    a third step of receiving an input of an initial image value $f_0$ and obtaining two offset-adjusted signals $fL_0$' and $fU_0$' from the an initial image value f0;
    a fourth step of obtaining projection signals PL and PU using the sensitivity information S obtained in the first step and the two offset-adjusted signals $fL_0$' and $fU_0$' of the initial image value obtained in the third step;
    a fifth step of obtaining coefficients real_cL, imag_cL, real_cU, and imag_cU using the sensitivity information S obtained in the first step, the offset-adjusted signals gL' and gU' obtained in the second step, and the projection signals PL and PU obtained in the fourth step;
    a sixth step of reconfiguring an image by multiplying the coefficients real_cL, imag_cL, real_cU, and imag_cU obtained in the fifth step by the offset-adjusted signals $fL_0$' and $fU_0$' of the initial image value obtained in the third step, and acquiring a first target image $f_1$ through combination of the images; and
    a seventh step of replacing the input value in the third step by the first target image $f_1$ obtained in the sixth step and repeatedly performing the third to sixth steps until a final target image is acquired.

2. The MR imaging method of claim 1, wherein the second step comprises:
    defining two arbitrary complex constants L and U so as to satisfy an image f to be reconstructed and inequalities $$\text{real}(L)<\text{real}(f)<\text{real}(U), \text{imag}(L)<\text{imag}(t)<\text{imag}(U)$$

(where, real(x) and imag(x) are operators extracting a real part and an imaginary part of x); and
    obtaining an offset-adjusted signal g' through an operation of
    gL'=g−Radon(L),
    gU'=Radon(U)−g.
    (where, Radon(x) is Radon transform of x),
    from the constants L and U that satisfy the inequalities in the above step.

3. The MR imaging method of claim 2, wherein the third step obtains the one offset-adjusted signal $fL_0$' by subtracting the complex constant L from the initial image value, and obtains the other offset-adjusted signal $fU_0$' by subtracting the initial image value $f_0$ from the other complex constant U.

4. The MR imaging method of claim 3, wherein the fourth step obtains the projection signals PL and PU by multiplying the two offset-adjusted signals $fL_0$' and $fU_0$' obtained in the third step by the sensitivity information S obtained in the first step and performing Radon transform on the result of multiplication.

5. The MR imaging method of claim 4, wherein the coefficients real_cL, imag_cL, real_cU, and imag_cU in the fifth step are obtained through an operation of $$\text{real}\_cL=(\text{real}(gL')/\text{real}(fL_0'))*S,$$

$$\text{imag}\_cL=(\text{imag}(gL')/\text{imag}(fL_0'))*S,$$

$$\text{real}\_cU=(\text{real}(gU')/\text{real}(fU_0'))*S,$$

$$\text{imag}\_cU=(\text{imag}(gU')/\text{imag}(fU_0'))*S.$$

6. The MR imaging method of claim 5, wherein the first target image $f_1$ in the sixth step is obtained through an operation of $$A=\text{real}(fL_0')*\text{real}\_cL+i*\text{imag}(fL_0')*\text{imag}\_cL,$$

$$B=\text{real}(fU_0')*\text{real}\_cU+i*\text{imag}(fU_0')*\text{imag}\_cU,$$

$$f_1=(A*U+B*L)/(A+B).$$

* * * * *